United States Patent
Takano et al.

(10) Patent No.: US 8,933,161 B2
(45) Date of Patent: Jan. 13, 2015

(54) THERMOPLASTIC RESIN COMPOSITION, RESIN MOLDED ARTICLE, AND METHOD OF MANUFACTURING RESIN MOLDED ARTICLE WITH PLATED LAYER

(75) Inventors: Takahiro Takano, Hiratsuka (JP); Takahiko Sumino, Hiratsuka (JP); Kentarou Ishihara, Hiratsuka (JP); Bernardus Antonius Gerardus Schrauwen, Leende (NL)

(73) Assignees: Mitsubishi Chemical Europe GmbH, Duesseldorf (DE); Mitsubishi Engineering-Plastics Corporation, Tokyo (JP)

( * ) Notice: Subject to any disclaimer, the term of this patent is extended or adjusted under 35 U.S.C. 154(b) by 0 days.

(21) Appl. No.: 14/005,692

(22) PCT Filed: Mar. 16, 2012

(86) PCT No.: PCT/JP2012/056886
§ 371 (c)(1),
(2), (4) Date: Sep. 17, 2013

(87) PCT Pub. No.: WO2012/128219
PCT Pub. Date: Sep. 27, 2012

(65) Prior Publication Data
US 2014/0002311 A1    Jan. 2, 2014

(30) Foreign Application Priority Data

Mar. 18, 2011 (EP) .................................. 11158893
Dec. 14, 2011 (JP) ............................... 2011-273041
Dec. 14, 2011 (JP) ............................... 2011-273042

(51) Int. Cl.
*B60C 1/00*        (2006.01)
*C08J 5/04*        (2006.01)
(Continued)

(52) U.S. Cl.
CPC ................ *C08K 13/04* (2013.01); *C08J 5/043* (2013.01); *C23C 18/38* (2013.01); *C23C 18/204* (2013.01); *C23C 18/1608* (2013.01);
(Continued)

(58) Field of Classification Search
USPC ........................................................ 524/494
See application file for complete search history.

(56) References Cited

U.S. PATENT DOCUMENTS 6,214,917 B1    4/2001   Linzmeier et al.
7,060,421 B2    6/2006   Naundorf et al.
(Continued)

FOREIGN PATENT DOCUMENTS

CN       1147227 A     4/1997
CN       1769348 A     5/2006
(Continued)

OTHER PUBLICATIONS

International Preliminary Report on Patentability for International Application No. PCT/JP2012/056886 dated Sep. 24, 2013.
(Continued)

*Primary Examiner* — Ling Choi
*Assistant Examiner* — Thuy-Ai Nguyen
(74) *Attorney, Agent, or Firm* — Birch, Stewart, Kolasch & Birch, LLP

(57) ABSTRACT

Provided is a thermoplastic resin molded article excellent in bending strength, flexural modulus and Charpy impact strength, on which the plated layer may be formed in a successful manner. The thermoplastic resin composition for laser direct structuring comprising, per 100 parts by weight of the thermoplastic resin, 10 to 150 parts by weight of an inorganic fiber and 1 to 30 parts by weight of a laser direct structuring additive, the laser direct structuring additive containing at least one of copper, antimony and tin, and having a Mohs hardness 1.5 or more smaller than the Mohs hardness of the inorganic fiber.

21 Claims, 1 Drawing Sheet

(51) Int. Cl.

| | | |
|---|---|---|
| *C23C 18/20* | (2006.01) | |
| *C23C 18/16* | (2006.01) | |
| *C08G 69/26* | (2006.01) | |
| *C08K 13/04* | (2006.01) | |
| *H05K 3/18* | (2006.01) | |
| *B41M 5/26* | (2006.01) | |
| *H01Q 1/38* | (2006.01) | |
| *C08L 77/06* | (2006.01) | |
| *C08K 7/04* | (2006.01) | |
| *C23C 18/38* | (2006.01) | |
| *C08K 9/02* | (2006.01) | |
| *H05K 1/03* | (2006.01) | |
| *C08K 3/22* | (2006.01) | |

(52) U.S. Cl.
CPC ........... *C08J 2377/00* (2013.01); *C08G 69/265* (2013.01); *C08K 9/02* (2013.01); *H05K 1/0366* (2013.01); *H05K 2201/09118* (2013.01); *H05K 2201/0129* (2013.01); *H05K 3/185* (2013.01); *H05K 2201/0236* (2013.01); *B41M 5/265* (2013.01); *H01Q 1/38* (2013.01); *C08L 77/06* (2013.01); *H05K 2201/0293* (2013.01); *C23C 18/1641* (2013.01); *C23C 18/1612* (2013.01); *C08K 3/2279* (2013.01); *C08K 7/04* (2013.01); *H05K 2203/107* (2013.01); *H05K 2201/0999* (2013.01)
USPC ....................................................... 524/494

(56) References Cited

U.S. PATENT DOCUMENTS

| 8,309,640 | B2 * | 11/2012 | Li et al. ................ 524/404 |
|---|---|---|---|
| 2004/0013969 | A1 | 1/2004 | Delp et al. |
| 2004/0241422 | A1 | 12/2004 | Naundorf et al. |
| 2006/0083939 | A1 | 4/2006 | Dunbar et al. |
| 2007/0032569 | A1 | 2/2007 | Langdon et al. |
| 2009/0292048 | A1 | 11/2009 | Li et al. |
| 2009/0292051 | A1 | 11/2009 | Li et al. |
| 2011/0251326 | A1 | 10/2011 | Van Hartingsveldt et al. |
| 2012/0276390 | A1 | 11/2012 | Ji et al. |
| 2013/0143994 | A1 | 6/2013 | Van Hartingsveldt et al. |

FOREIGN PATENT DOCUMENTS

| CN | 1970202 A | 5/2007 |
|---|---|---|
| CN | 101724259 A | 6/2010 |
| CN | 101784607 A | 7/2010 |
| CN | 102066122 A | 5/2011 |
| CN | 103249572 A | 8/2013 |
| DE | 10 2004 045305 A1 | 3/2006 |
| EP | 2233519 A1 | 9/2010 |
| JP | 10-130485 A | 5/1998 |
| JP | 2000-503817 A | 3/2000 |
| JP | 2004-534408 A | 11/2004 |
| JP | 2006-124701 A | 5/2006 |
| JP | 2010-536947 A | 12/2010 |
| WO | WO 03/005784 A2 | 1/2003 |
| WO | WO 2009/024496 A2 | 2/2009 |
| WO | WO 2009/141800 A2 | 11/2009 |
| WO | WO 2011/076729 A1 | 6/2011 |
| WO | WO 2012/056416 A1 | 5/2012 |

OTHER PUBLICATIONS

International Search Report for International Application No. PCT/JP2012/056886 dated May 22, 2012.
Written Opinion of International Search Report with English language translation for International Application No. PCT/JP2012/056886 dated May 22, 2012.
Chinese Office Action and Search Report for Chinese Application No. 201280003221.3 with English translation, dated Dec. 27, 2013.
European Search Report for European Patent Application No. 12760231.6 dated Nov. 5, 2013.
Huske et al., Laser Supported Activation and Additive Metallization of Thermoplastics for 3D-MIDS. Proceedings of the 3rd LANE, Aug. 28-31, 2001, pp. 1-12.
Information Disclosure Statement for U.S. Appl. No. 13/822,973 dated Mar. 13, 2013.
Information Disclosure Statement for U.S. Appl. No. 13/822,973 dated Nov. 15, 2013.
International Search Report and Preliminary Report on Patentability for International Application No. PCT/EP2012/054667 dated Apr. 12, 2012.
Silvia Rosenberger, Wolf-Technologieseminar, 2005, pp. 1-53.
U.S. Office Action, dated Jun. 25, 2014, for U.S. Appl. No. 13/822,973.
Chinese Office Action dated Mar. 26, 2014 for Chinese Application No. 201280013883.9 with English translation.
Chinese Office Action dated Aug. 26, 2014 for Application No. 201280013883.9 with English language translation.

* cited by examiner

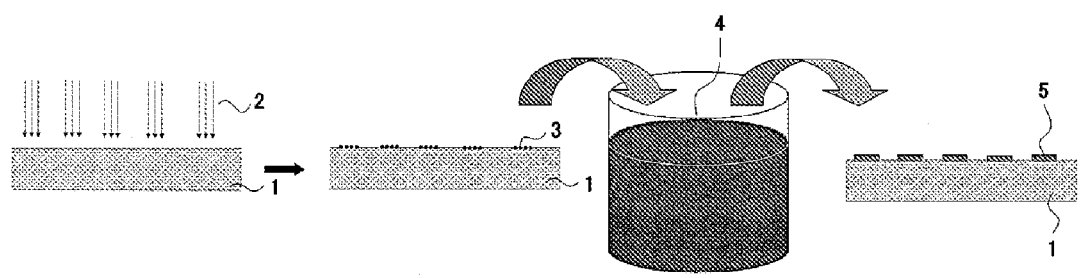

THERMOPLASTIC RESIN COMPOSITION, RESIN MOLDED ARTICLE, AND METHOD OF MANUFACTURING RESIN MOLDED ARTICLE WITH PLATED LAYER

TECHNICAL FIELD

The present invention relates to a thermoplastic resin composition for laser direct structuring (on occasions, simply referred to a "thermoplastic resin composition", hereinafter). The present invention also relates to a resin molded article obtained by forming the thermoplastic resin composition, and, a method of manufacturing a resin molded article with a plated layer, having a plated layer formed on the surface of the resin molded article.

BACKGROUND ART

In recent years, with advances in development of mobile phones including smartphone, methods of manufacturing an antenna inside the mobile phones have extensively been investigated. In particular, there has been a strong demand for a method which enables three-dimensional design of antenna in the mobile phones. As one known technique of manufacturing such three-dimensional antenna, laser direct structuring (occasionally referred to as "LDS", hereinafter) has been attracting public attention. The LDS is a technique of typically irradiating laser light onto the surface of a resin molded article which contains an LDS additive so as to activate only the portion irradiated by the laser light, and applying a metal to the activated portion to thereby form a plated layer. The technique is characterize by that a metal structure such as antenna may be formed directly onto the surface of a resin base, without using an adhesive or the like. The LDS technique is disclosed, for example, in Patent Literatures 1 to 3.

CITATION LIST

Patent Literature

[Patent Literature 1] Published Japanese Translation of PCT International Publication for Patent Application No. 2000-503817
[Patent Literature 2] Published Japanese Translation of PCT International Publication for Patent Application No. 2004-534408
[Patent Literature 3] International Patent Publication WO2009/141800, Pamphlet

SUMMARY OF THE INVENTION

Technical Problem

The present inventors found out from our investigations that, although the plated layer was successfully formed when the LDS additive was added to the thermoplastic resins preliminarily mixed with an inorganic fiber, an expected level of mechanical strength with the aid of the inorganic fiber was not achieved in some cases, depending on species of the LDS additive.

The present invention is aimed at solving the problems in the prior art described above, and an object of which is to provide a thermoplastic resin composition added with an inorganic fiber and an LDS additive, capable of being appropriately plated, and excellent in the mechanical strength.

Solution to Problem

Under the circumstances, the present inventors conducted thorough investigations, and found out that the poor mechanical strength could be ascribable to relation between values of Mohs hardness of the inorganic fiber and the LDS additive. The present invention was conceived based on the finding. More specifically, the problems described above were solved by the configurations described below.

<1> A thermoplastic resin composition for laser direct structuring comprising, per 100 parts by weight of the thermoplastic resin, 10 to 150 parts by weight of an inorganic fiber and 1 to 30 parts by weight of a laser direct structuring additive, the laser direct structuring additive containing at least one of copper, antimony and tin, and having a Mohs hardness 1.5 or more smaller than the Mohs hardness of the inorganic fiber.
<2> The thermoplastic resin composition for laser direct structuring of <1>, wherein the inorganic fiber is a glass fiber.
<3> The thermoplastic resin composition for laser direct structuring of <1> or <2>, wherein the thermoplastic resin is a polyamide resin.
<4> The thermoplastic resin composition for laser direct structuring of any one of <1> to <3>, further comprising, per 100 parts by weight of the thermoplastic resin composition, 1 to 20 parts by weight of an inorganic pigment having an L* value in the CIELab of 80 or larger and a Mohs hardness 1.5 or more smaller than the Mohs hardness of the inorganic fiber.
<5> The thermoplastic resin composition for laser direct structuring of any one of <1> to <4>, further comprising, per 100 parts by weight of the thermoplastic resin composition, 1 to 20 parts by weight of talc.
<6> The thermoplastic resin composition for laser direct structuring of any one of <1> to <4>, further comprising, per 100 parts by weight of the thermoplastic resin composition, 1 to 20 parts by weight of talc, and the amount of addition, per 100 parts by weight of the thermoplastic resin, of the laser direct structuring additive is 1 to 15 parts by weight.
<7> The thermoplastic resin composition for laser direct structuring of anyone of claims 1 to 6, wherein the inorganic fiber has a Mohs hardness of 5.5 or larger, and the laser direct structuring additive contains copper and has a Mohs hardness of 5.0 or smaller.
<8> The thermoplastic resin composition for laser direct structuring of <7>, further comprising an alkali.
<9> The thermoplastic resin composition for laser direct structuring of <7> or <8>, wherein the inorganic pigment has a Mohs hardness of 5.0 or smaller.
<10> The thermoplastic resin composition for laser direct structuring of any one of <7> to <9>, wherein the laser direct structuring additive is $Cu_3(PO_4)_2Cu(OH)_2$.
<11> The thermoplastic resin composition for laser direct structuring of anyone of <1> to <6>, wherein the laser direct structuring additive contains antimony and tin.
<12> The thermoplastic resin composition for laser direct structuring of <11>, wherein the laser direct structuring additive contains antimony and tin, and the content of tin is larger than the content of antimony.
<13> The thermoplastic resin composition for laser direct structuring of <11> or <12>, wherein the laser direct structuring additive contains antimony oxide and/or tin oxide.
<14> The thermoplastic resin composition for laser direct structuring of <13>, wherein the laser direct structuring additive contains 36 to 50% by weight of $(Sb/Sn)O_2$, 35 to 53% by weight of a mixture of mica and $SiO_2$, and 11 to 15% by weight of $TiO_2$.
<15> A resin molded article obtained by molding the thermoplastic resin composition for laser direct structuring described in any one of <1> to <14>.
<16> The resin molded article of <15>, further comprising a plated layer formed on the surface thereof.

<17> The resin molded article of <15> or <16>, configured as a component for a portable electronic instrument.
<18> The resin molded article of <16> or <17>, wherein the plated layer functions as an antenna.
<19> A method of manufacturing a resin molded article with a plated layer, the method comprising irradiating the surface of a resin molded article, obtained by molding the thermoplastic resin composition for laser direct structuring described in any one of <1> to <14>, and applying a metal to thereby form the plated layer.
<20> The method of manufacturing a resin molded article with a plated layer of <19>, wherein the plated layer is a copper plated layer.
<21> A method of manufacturing a component for a portable electronic instrument with an antenna, the method comprising the method of manufacturing a resin molded article with a plated layer of <16> or <17>.

Advantageous Effects of Invention

According to the present invention, it became now possible to provide a thermoplastic resin molded article excellent in bending strength, flexural modulus and Charpy impact strength, on which the plated layer may be formed in a successful manner.

BRIEF DESCRIPTION OF DRAWINGS

FIG. 1 is a schematic drawing illustrating a process of forming a plated layer on the surface of a resin molded article. In FIG. 1, reference numeral 1 stands for a resin molded article, 2 for a laser light, 3 for portions irradiated by the laser light, 4 for a plating solution, and 5 for a plated layer.

DESCRIPTION OF EMBODIMENTS

The present invention will be detailed below. Note in this specification that the wording "to" with preceding and succeeding numerals is used for indicating a numerical range with the lower and upper limits thereof respectively given by these numerals.

The Mohs hardness used in the present invention is the 10-rank Mohs scale generally used as the standard of mineral hardness.

The thermoplastic resin composition of the present invention characteristically contains, per 100 parts by weight of a thermoplastic resin, 10 to 150 parts by weight of an inorganic fiber and 1 to 30 parts by weight of an LDS additive. The LDS additive contains at least one of copper, antimony and tin, and has a Mohs hardness 1.5 or more smaller than the Mohs hardness of the inorganic fiber.

The present invention will be detailed below.
<Thermoplastic Resin>
The thermoplastic resin composition of the present invention contains a thermoplastic resin. Species of the thermoplastic resin is not specifically limited, and is selectable, for example, from polycarbonate resin, alloy of polyphenylene ether resin and polystyrene-based resin, alloy of polyphenylene ether resin and polyamide resin, thermoplastic polyester resin, methyl methacrylate/acrylonitrile/butadiene/styrene copolymer resin, methyl methacrylate/styrene copolymer resin, methyl methacrylate resin, rubber-reinforced methyl methacrylate resin, polyamide resin, polyacetal resin, polylactic acid-based resin, polyolefin resin, and polyphenylene sulfide resin. In the present invention, polyamide resin, thermoplastic polyester resin and polyphenylene sulfide resin are preferably used, and polyamide resin is more preferably used. Only one species of the thermoplastic resin may be used, or two or more species thereof may be used in combination.

The polycarbonate resin is selectable considering the description in paragraphs [0008] to [0013] of JP-A-2008-120866.

The thermoplastic polyester resin is selectable considering the description in paragraphs [0013] to [0016] of JP-A-2010-174223.

The polyacetal resin is selectable considering the description in paragraph [0011] of JP-A-2003-003041, and paragraphs [0018] to [0020] of JP-A-2003-220667.

The polyphenylene sulfide resin is selectable considering the descriptions in paragraphs [0014] to [0016] of JP-A-H10-292114, paragraphs [0011] to [0013] of JP-A-H10-279800, and paragraphs [0011] to [0015] of JP-A-2009-30030.

The polyamide resin is selectable considering the description in paragraphs [0011] to [0013] of JP-A-2011-132550. The polyamide resin preferably has diamine structural units (structural units derived from diamine), 50 mol % or more of which being derived from xylylene diamine. More specifically, the polyamide resin is a xylylene diamine-based polyamide resin polycondensed with a dicarboxylic acid, in which 50 mol % or more of diamine is derived from xylylene diamine.

The xylylene diamine-based polyamide resin preferably has the diamine structural unit, 70 mol % or more, and more preferably 80 mol % or more of which being derived from meta-xylylene diamine and/or para-xylylene diamine, and preferably has the dicarboxylic acid structural units (structural units derived from dicarboxylic acid), 50 mol % or more, more preferably 70 mol % or more, and particularly 80 mol % or more of which being derived from $C_{4-20}$ α,ω-straight chain aliphatic dicarboxylid acid. The $C_{4-20}$ α,ω-straight chain aliphatic dibasic acid preferably used herein includes adipic acid, sebacic acid, suberic acid, dodecanedioic acid and eicodionic acid.

<Inorganic Fiber>
The thermoplastic resin composition of the present invention contains an inorganic fiber. The present invention is characterized in that the LDs additive has a Mohs hardness 1.5 or more smaller than the Mohs hardness of the inorganic fiber, or conversely, the inorganic fiber has a Mohs hardness 1.5 or more larger than the Mohs hardness of the LDS additive. Difference of the Mohs hardness between the inorganic fiber and the LDS additive is preferably 1.5 to 6.5, and more preferably 1.5 to 5.5. Only a single species of the inorganic fiber may be used, or two or more species thereof may be used in combination.

The inorganic fiber is exemplified by glass fiber, milled fiber, alumina fiber, potassium titanate whisker, and metal fibers such as steel fiber and stainless steel fiber, wherein glass fiber is preferable. The glass fiber generally used for the thermoplastic resin is composed of E-glass, and generally has a Mohs hardness of 6.5.

The glass fiber preferably used in the present invention preferably has an average diameter of 20 μm or smaller, and more preferably 1 to 15 μm, from the viewpoints of further improving a balance among physical characteristics (strength, rigidity, heat distortion resistance, impact strength), and of further reducing warpage of the molded article. While glass fiber with circular cross section is used most often, the cross sectional geometry is not specifically limited in the present invention, so that any fiber having a cross sectional geometry of cocoon, ellipse or rectangle may equally be used.

Length of the glass fiber is not specifically limited, and is selectable from those of long fiber type (roving) and short fiber type (chopped strand). The filament number is preferably 100 to 5,000 or around. Alternatively, so long as the glass fiber after being kneaded into the thermoplastic resin composition can keep an average length of 0.1 mm or longer, the glass fiber may be a crushed product which is so-called milled fiber of glass powder, or may be a sliver composed of continuous monofilaments. Also alkali-free source glass is preferable, which is exemplified by E-glass, C-glass and S-glass. In the present invention, E-glass is preferably used.

The glass fiber is preferably surface-treated with a silane coupling agent such as γ-methacryloxypropyl trimethoxysilane, γ-glycidoxypropyl trimethoxysilane or γ-aminopropyl triethoxysilane, with an amount of adhesion thereof of 0.01 to 1% by weight of the weight of glass fiber, in general. Further depending on needs, also the glass fibers surface-treated with fatty acid amide compound, lubricant such as silicone oil, antistatic agent such as quaternary ammonium salt, resin with film forming ability such as epoxy resin, urethane resin or the like, and mixture of resin with film forming ability with heat stabilizer, flame retardant or the like.

When a copper-containing material is used as the LDS additive, the thermoplastic resin composition of the present invention preferably contains the inorganic fiber having a Mohs hardness of 5.5 or larger, more preferably 5.5 to 8, and furthermore preferably 5.5 to 7.5. By virtue of this configuration, there will be a tendency of exhibiting the effects of the present invention in a more intensive manner.

Amount of addition of the inorganic fiber in the thermoplastic resin composition of the present invention, per 100 parts by weight of the thermoplastic resin, is 10 to 150 parts by weight, preferably 10 to 130 parts by weight, and more preferably 20 parts by weight or more and less than 100 parts by weight.

In the thermoplastic resin composition of the present invention, the thermoplastic resin and the inorganic fiber in total generally account for 60% by weight or more of the whole component.

<Laser Direct Structuring Additive>

The thermoplastic resin composition of the present invention contains at least one species of copper, antimony and tin, and, has a Mohs hardness 1.5 or more smaller than the Mohs hardness of the inorganic fiber. Only one species of the LDS additive may be used, or two or more species thereof may be used in combination.

The LDS additive in the present invention means a compound which enables formation of a metal plated layer on the laser-irradiated surface of PA-MP6 (MAMP6 synthesized in Example described later) resin from Mitsubishi Gas Chemical Corporation, Inc., when 100 parts by weight of the resin is added with 4 parts by weight of an additive which is supposed to be the LDS additive, irradiated by a 1064 nm YAG laser light at an output power of 10 W, at a frequency of 80 kHz and at a speed of 3 m/s, and then subjected to electroless plating in M-Copper 85 plating bath from MacDermid, Inc. The LDS additive used in the present invention may be a synthetic product or may be a commercially available product. The commercially available product may be those marketed as the LDS additive, or may be those marketed for any other purposes, so long as the requirements of the present invention may be satisfied. While many of publicly known LDS additives have appeared black, the present invention allows use of LDS additives which appear not black, so that the resin molded article may now be colored.

The LDS additive preferably has a Mohs hardness of 1.0 to 5.0, and more preferably 2.0 to 5.0. Average grain diameter of the LDS additive is preferably 0.01 to 50 μm, and more preferably 0.05 to 30 μm. By virtue of this configuration, there will be a tendency of improving surface profile of the plated surface after plating.

Amount of addition of the LDS additive in the thermoplastic resin composition of the present invention, per 100 parts by weight of the thermoplastic resin, is 1 to 30 parts by weight, preferably 2 to 25 parts by weight, and more preferably 3 to 18 parts by weight. As described later, the LDS additive, when combined with talc, will enable formation of the plated layer only with a small amount of addition.

Preferable embodiments of the LDS additive used in the present invention will be described below. By using the LDS additive of this embodiment, there will be a tendency of exhibiting the effects of the present invention in a more intensive manner. The present invention is, however, not limited to these embodiments of course.

A first embodiment of the LDS additive used in the present invention relates to a copper-containing LDS additive. In the first embodiment, content of copper from among metal components in the LDS additive is preferably 20 to 95% by weight. One preferable example of the copper-containing LDS additive is $Cu_3(PO_4)_2Cu(OH)_2$.

A second embodiment of the LDS additive used in the present invention relates to an LDS additive containing antimony and/or tin. Content of each of antimony and tin, from among metal components in the LDS additive which contains only either of antimony and tin as the metal component, is preferably 1 to 95% by weight, and more preferably 1.5 to 60% by weight. In an embodiment containing both of antimony and tin, the total content of antimony and tin, from among the metal components in the LDS additive, is preferably 90% by weight or more, and more preferably 90 to 100% by weight.

In the second embodiment of the LDS additive, an LDS additive containing antimony and tin is a preferably example. In this embodiment, the LDS additive more preferably contains both of antimony and tin, with a larger content of tin than antimony, and furthermore preferably contains both of antimony and tin, and contains antimony oxide and/or tin oxide, with a larger content of tin than antimony.

The LDS additive used in the present invention is exemplified by tin doped with antimony, tin oxide doped with antimony, and tin oxide doped with antimony oxide.

<Alkali>

The thermoplastic resin composition of the present invention may contain an alkali. When the LDS additive used in the present invention is an acidic substance (with an acidity of pH6 or below, for example), the resin molded article may sometimes be mottled in color since the LDS additive per se may be reduced due to combination with the resin. By adding the alkali, it is now possible to make the color of the resultant resin molded article more uniform. Alkali is selectable from calcium hydroxide, magnesium hydroxide and forth, without special limitation. Only one species of alkali may be used, or two or more species thereof may be used in combination. For example, the copper-containing LDS additive ($Cu_3(PO_4)_2Cu(OH)_2$) described above corresponds to the acidic LDS additive.

Although depending on species of the LDS additive and species of the alkali, amount of addition of the alkali in the thermoplastic resin composition of the present invention is preferably 0.01 to 3% by weight relative to the amount of addition of the LDS additive, and more preferably 0.05 to 1% by weight.

<Inorganic Pigment>

The thermoplastic resin composition of the present invention may contain an inorganic pigment. In the present invention, the resin molded article may be colored by adding the inorganic pigment. Only one species of the inorganic pigment may be used, or two or more species thereof may be used in combination. The inorganic pigment preferably has an L* value in the CIELab of 80 or larger, and a Mohs hardness of 5.0 or smaller. The L* value is more preferably 50 to 100. The Mohs hardness of the inorganic pigment is more preferably 2 to 5, and furthermore preferably 2.5 to 4.5.

This sort of inorganic pigment is exemplified by ZnS (L* value: 87 to 95, Mohs hardness: 3 to 3.5), and ZnO (L* value: 88 to 96, Mohs hardness: 4 to 5). ZnS is more preferable.

When the thermoplastic resin composition of the present invention used herein contains copper as the LDS additive, the inorganic pigment used therein preferably has a Mohs hardness of 5.0 or smaller. By using this sort of inorganic pigment, there will be a tendency of exhibiting the effects of the present invention in a more intensive manner.

Amount of mixing of the inorganic pigment in the thermoplastic resin composition of the present invention, per 100 parts by weight of the thermoplastic resin composition, is preferably 0.1 to 20 parts by weight, more preferably 0.3 to 15 parts by weight, and furthermore preferably 0.5 to 12 parts by weight.

<Talc>

The thermoplastic resin composition of the present invention may contain talc. In the present invention, by mixing talc, an appropriate plated layer may be formed even with a reduced amount of addition of the LSD additive.

Amount of mixing of talc in the thermoplastic resin composition of the present invention, per 100 parts by weight of the thermoplastic resin composition, is preferably 1 to 20 parts by weight, more preferably 2 to 15 parts by weight, and furthermore preferably 2 to 10 parts by weight. By mixing talc, the amount of mixing of the LDS additive, per 100 parts by weight of the thermoplastic resin, may be reduced down for example to 1 to 15 parts by weight, and further down to 1 to 10 parts by weight.

The thermoplastic resin composition of the present invention may contain other various additives, without impairing the effects of the present invention. Such additives include mold releasing agent, light stabilizer, heat stabilizer, antioxidant, UV absorber, flame retardant, dye/pigment, fluorescent brightener, anti-dripping agent, antistatic agent, anti-clouding agent, lubricant, anti-blocking agent, flow improver, plasticizer, dispersant, and antibacterial agent.

Only a single species of these components may be used, or two or more species thereof may be used in combination. In the thermoplastic resin composition of the present invention, 99% by weight or more of the components other than the inorganic fiber preferably have values of Mohs hardness smaller than that of the inorganic fiber component, and all of the components other than the inorganic fiber preferably have values of Mohs hardness smaller than that of the inorganic fiber component.

<Mold Releasing Agent>

The mold releasing agent is exemplified by aliphatic carboxylic acid, ester formed between aliphatic carboxylic acid and alcohol, aliphatic hydrocarbon compound with a number average molecular weight of 200 to 15,000, and polysiloxane-based silicone oil.

The aliphatic carboxylic acid is exemplified by saturated or unsaturated, aliphatic mono-, di- and tri-carboxylic acids. The aliphatic carboxylic acid herein also includes alicyclic carboxylic acids. Among them, preferable examples of the aliphatic carboxylic acid include $C_{6-36}$ mono- and di-carboxylic acids, wherein $C_{6-36}$ aliphatic saturated mono-carboxylic acid is more preferable. Specific examples of the aliphatic carboxylic acid include palmitic acid, stearic acid, caproic acid, capric acid, lauric acid, arachic acid, behenic acid, lignoceric acid, cerotic acid, mellisic acid, tetratriacontanoic acid, montanic acid, adipic acid, and azelaic acid.

The aliphatic carboxylic acid composing the ester formed between the aliphatic carboxylic acid and alcohol may be those described above. On the other hand, the alcohol is exemplified by saturated or unsaturated, monohydric or polyhydric alcohol. These alcohols may have a substituent such as fluorine atom, aryl group or the like. Among them, $C_{30}$ or shorter monohydric or polyhydric, saturated alcohol is preferable, and $C_{30}$ or shorter aliphatic or alicyclic saturated monohydric alcohol or aliphatic saturated polyhydric alcohol is more preferable.

Specific examples of the alcohol include octanol, decanol, dodecanol, stearyl alcohol, behenyl alcohol, ethylene glycol, diethylene glycol, glycerin, pentaerythritol, 2,2-dihydroxyperfluoropropanol, neopentyl glycol, ditrimethylolpropane, and dipentaerythritol.

Specific example of the ester formed between the aliphatic carboxylic acid and the alcohol include beeswax (mixture mainly composed of myricyl palmitate), stearyl stearate, behenyl behenate, stearyl behenate, glycerin monopalmitate, glycerin monostearate, glycerin distearate, glycerin tristearate, pentaerythritol monopalmitate, pentaerythritol monostearate, pentaerythritol distearate, pentaerythritol tristearate, and pentaerythritol tetrastearate.

The aliphatic hydrocarbon with a number average molecular weight of 200 to 15,000 is exemplified by liquid paraffin, paraffin wax, microwax, polyethylene wax, Fischer-Tropsch wax, and $C_{3-12}$ α-olefin oligomer. The aliphatic hydrocarbon herein include also alicyclic hydrocarbon. The number average molecular weight of the aliphatic hydrocarbon is preferably 5,000 or smaller.

Among them, paraffin wax, polyethylene wax and partially oxidized polyethylene wax are preferable, and paraffin wax and polyethylene wax are more preferable.

Content of the mold releasing agent, per 100 parts by weight in total of the thermoplastic resin and the inorganic fiber, is generally 0.001 parts by weight or more, preferably 0.01 parts by weight or more, and, generally 2 parts by weight or less, and preferably 1 part by weight or less. If the content of the mold releasing agent is less than the lower limit value of the above described range, the mold releasing effect will not always fully be exhibited, whereas the content of the mold releasing agent exceeding the upper limit value of the above described range may result in degraded anti-hydrolytic performance and pollution of dies in injection molding.

<Light Stabilizer>

The light stabilizer is exemplified by UV-absorbing compounds such as benzophenone-based compound, salicylate-based compound, benzotriazole-based compound, and cyano acrylate-based compound, and radical-scavenging compounds such as hindered amine-based compound and hindered phenol-based compound.

By combining the UV-absorbing compound and the radical-scavenging compound for use as the light stabilizer, a higher degree of stabilizing effect may be exhibited.

Only a single species of the light stabilizer may be used, or two or more species thereof may be used in combination.

The benzophenone-based compound is exemplified by, but not specifically limited to, 2-hydroxy-4-n-octoxybenzophenone, 2,2'-dihydroxy-4-methoxybenzophenone, 2,2'-dihydroxy-4,4'-dimethoxybenzophenone, 2,2'4,4'-tetrahydroxybenzophenone, 2-hydroxy-4-methoxybenzophenone, 2,4-dihydroxybenzophenone, and 2-hydroxy-4-octyloxybenzophenone.

The salicylate-based compound is exemplified by, but not specifically limited to, phenyl salicylate, p-t-butylphenyl salicylate, and p-octylphenyl salicylate.

The benzotriazole-based compound is exemplified by, but not specifically limited to, 2-(2'-hydroxy-5'-methylphenyl)benzotriazole, 2-(3-t-butyl-5-methyl-2-hydroxyphenyl)-5-chlorobenzotriazole, 2-(2'-hydroxy-3',5'-di-t-butylphenyl)benzotriazole, 2-(2'-hydroxy-5'-t-octylphenyl)benzotriazole, 2-(2'-hydroxy-3'-t-butyl-5'-methylphenyl)-5-chlorobenzotriazole, 2-(2'-hydroxy-3',5'-di-t-butylphenyl)-5-chlorobenzotriazole, 2-(2'-hydroxy-3',5'-di-t-aminophenyl)benzotriazole, 2-{2'-hydroxy-3'-(3",4",5",6"-tetrahydrophthalimidemethyl)-5'-methylphenyl}benzotriazole, 2,2-methylenebis{4-(1,1,3,3-tetramethylbutyl)-6-(2H-benzotriazole-2-yl)phenol}, and 6-(2-benzotriazolyl)-4-t-octyl-6'-t-butyl-4'-methyl-2,2'-methylenebisphenol.

The cyano acrylate-based compound is exemplified by, but not specifically limited to, 2-ethylhexyl-2-cyano-3,3'-diphenyl acrylate, and ethyl-2-cyano-3,3'-diphenyl acrylate.

The hindered amine-based compound is exemplified by, but not specifically limited to, bis(2,2,6,6-tetramethyl-4-piperidyl) sebacate, bis(2,2,6,6-tetramethyl-4-piperidyl) succinate, bis(1,2,2,6,6-pentamethyl-4-piperidyl) sebacate, bis(1-octyloxy-2,2,6,6-tetramethyl-4-piperidyl) sebacate, bis(1,2,2,6,6-pentamethyl-4-piperidyl)-n-butyl-3,5-di-t-butyl-4-hydroxybenzyl malonate, condensate of 1-(2-hydroxyethyl)-2,2,6,6-tetramethyl-4-hydroxypiperidine and succinic acid, straight chain-like or cyclic condensate of N,N'-bis(2,2,6,6-tetramethyl-4-piperidyl)hexamethylenediamine and 4-tert-octylamino-2,6-dichloro-1,3,5-triazine, tris(2,2,6,6-tetramethyl-4-piperidyl)nitrilotriacetate, tetrakis(2,2,6,6-tetramethyl-4-piperidyl)-1,2,3,4-butanetetracarboxylate, 1,1'-(1,2-ethanediyl)-bis(3,3,5,5-tetramethylpiperazinone), 4-benzoyl-2,2,6,6-tetramethylpiperidine, 4-stearyloxy-2,2,6,6-tetramethylpiperidine, bis(1,2,2,6,6-pentamethylpiperidyl)-2-n-butyl-2-(2-hydroxy-3,5-di-t-butylbenzyl) malonate, 3-n-octyl-7,7,9,9-tetramethyl-1,3,8-triazaspiro[4.5]decane-2,4-dione, bis(1-octyloxy-2,2,6,6-tetramethylpiperidyl) sebacate, bis(1-octyloxy-2,2,6,6-tetramethylpiperidyl) succinate, N,N'-bis(2,2,6,6-tetramethyl-4-piperidinyl)-1,3-benzene dicarboxamide, straight chain-like or cyclic condensate of N,N'-bis(2,2,6,6-tetramethyl-4-piperidyl)-hexamethylene diamine and 4-morpholino-2,6-dichloro-1,3,5-triazine, condensate of 2-chloro-4,6-bis(4-n-butylamino-2,2,6,6-tetramethylpiperidyl)-1,3,5-triazine and 1,2-bis(3-aminopropylamino)ethane, condensate of 2-chloro-4,6-di-(4-n-butylamino-1,2,2,6,6-pentamethylpiperidyl)-1,3,5-triazine with 1,2-bis-(3-aminopropylamino)ethane, 8-acetyl-3-dodecyl-7,7,9,9-tetramethyl-1,3,8-triazaspiro[4.5]decane-2,4-dione, 3-dodecyl-1-(2,2,6,6-tetramethyl-4-piperidyl)pyrrolidine-2,5-dione, 3-dodecyl-1-(1,2,2,6,6-pentamethyl-4-piperidyl)pyrrolidine-2,5-dione, mixture of 4-hexadecyloxy- and 4-stearyloxy-2,2,6,6-tetramethylpiperidine, condensate of N,N'-bis(2,2,6,6-tetramethyl-4-piperidyl)hexamethylenediamine and 4-cyclohexylamino-2,6-dichloro-1,3,5-triazine, condensate of 1,2-bis(3-aminopropylamino)ethane with 2,4,6-trichloro-1,3,5-triazine and with 4-butylamino-2,2,6,6-tetramethylpiperidine (CAS No. [136504-96-6]); condensate of 1,6-hexanediamine with 2,4,6-trichloro-1,3,5-triazine and with N,N-dibutylamine and with 4-butylamino-2,2,6,6-tetramethylpiperidine (CAS No. [192268-64-7]); N-(2,2,6,6-tetramethyl-4-piperidyl)-n-dodecylsuccinimide, N-(1,2,2,6,6-pentamethyl-4-piperidyl)-n-dodecylsuccinimide, 2-undecyl-7,7,9,9-tetramethyl-1-oxa-3,8-diaza-4-oxo-spiro[4.5]decane, reaction product formed between 7,7,9,9-tetramethyl-2-cycloundecyl-1-oxa-3,8-diaza-4-oxo-spiro[4.5]decane and epichlorohydrin, 1,1-bis(1,2,2,6,6-pentamethyl-4-piperidyloxycarbonyl)-2-(4-methoxyphenyl)ethene, N,N'-bis-formyl-N,N'-bis(2,2,6,6-tetramethyl-4-piperidyl)hexamethylenediamine, diester formed between 4-methoxymethylenemalonic acid and 1,2,2,6,6-pentamethyl-4-hydroxypiperidine, poly[methylpropyl-3-oxy-4-(2,2,6,6-tetramethyl-4-piperidyl)]siloxane, reaction product formed between maleic anhydride-α-olefin copolymer and 2,2,6,6-tetramethyl-4-aminopiperidine or 1,2,2,6,6-pentamethyl-4-aminopiperidine, 2,4-bis[N-(1-cyclohexyloxy-2,2,6,6-tetramethylpiperidine-4-yl)-N-butylamino]-6-(2-hydroxyethyl)amino-1,3,5-triazine, 1-(2-hydroxy-2-methylpropoxy)-4-octadecanoyloxy-2,2,6,6-tetramethylpiperidine, 5-(2-ethylhexanoyl)oxymethyl-3,3,5-trimethyl-2-morpholinone, Sanduvor (from Clariant; CAS No. [106917-31-1]), 5-(2-ethylhexanoyl)oxymethyl-3,3,5-trimethyl-2-morpholinone, reaction product formed between 2,4-bis[(1-cyclohexyloxy-2,2,6,6-piperidine-4-yl)butylamino]-6-chloro-s-triazine and N,N'-bis(3-aminopropyl)ethyletediamine, 1,3,5-tris(N-cyclohexyl-N-(2,2,6,6-tetramethylpiperidine-3-one-4-yl)amino)-s-triazine, 1,3,5-tris(N-cyclohexyl-N-(1,2,2,6,6-pentamethylpiperazine-3-one-4-yl)amino)-s-triazine, N,N',N",N"'-tetrakis(4,6-bis(butyl-(N-methyl-2,2,6,6-tetramethylpiperidine-4-yl)amino)-triazine-2-yl)-4,7-diazadecane-1,10-diamine, and poly[[6-(1,1,3,3-tetramethylbutyl)amino-1,3,5-triazine-2,4-diyl][(2,2,6,6-tetramethyl-4-piperidyl)imino]hexamethylene{(2,2,6,6-tetramethyl-4-piperidyl)imino}]. Among them, bis(2,2,6,6-tetramethyl-4-piperidyl) sebacate, bis(2,2,6,6-tetramethyl-4-piperidyl) succinate, bis(1,2,2,6,6-pentamethyl-4-piperidyl) sebacate, N,N'-bis(2,2,6,6-tetramethyl-4-piperidinyl)-1,3-benzene dicarboxamide, and N,N',N",N"'-tetrakis-(4,6-bis-(butyl-(N-methyl-2,2,6,6-tetramethylpiperidine-4-yl)amino)-triazine-2-yl)-4,7-diazadecane-1,10-diamine are preferable.

The hindered phenol-based compound is exemplified by, but not specifically limited to, pentaerythrityl-tetrakis{3-(3,5-di-t-butyl-4-hydroxyphenyl)propionate}, N,N-hexamethylenebis(3,5-di-t-butyl-4-hydroxy-hydrocinnamide, triethylene glycol-bis{3-(3-t-butyl-5-methyl-4-hydroxyphenyl)propionate}, 3,9-bis{2-[3-(3-t-butyl-4-hydroxy-5-methylphenyl)propynyloxy]-1,1-dimethylethyl}-2,4,8,10-tetraoxaspiro[5.5]undecane, 3,5-di-t-butyl-4-hydroxybenzylphosphonate-diethyl ester, 1,3,5-trimethyl-2,4,6-tris(3,5-di-t-butyl-4-hydroxybenzyl)benzene, and 1,3,5-tris(4-t-butyl-3-hydroxy-2,6-dimethylbenzyl)isocyanate.

Content of the light stabilizer, per 100 parts by weight in total of the thermoplastic resin and the inorganic fiber, is generally 0.001 parts by weight or more, preferably 0.01 parts by weight or more, more preferably 0.03 parts by weight or more, and, generally 3 parts by weight or less, preferably 2 parts by weight or less, and more preferably 1 part by weight or less.

<Heat Stabilizer>

The resin composition of this embodiment may further contain a heat stabilizer. The heat stabilizer is at least one species selected form the group consisting of phenol-based compound, phosphite-based compound, hindered amine-based compound, triazine-based compound, and sulfur-containing compound.

Only a single species of the heat stabilizer may be used, or two or more species thereof may be used in combination.

The phenol-based compound is exemplified by, but not specifically limited to, hindered phenol-based compound. The hindered phenol-based compound is exemplified by N,N'-hexane-1,6-diyl-bis[3-(3,5-di-t-butyl-4-hydroxyphenylpropionamide), pentaerythrityl-tetrakis[3-(3,5-di-t-butyl-4-hydroxyphenyl)propionate], N,N'-hexamethylenebis(3,5-di-t-butyl-4-hydroxy-hydrocinnamide), triethylene glycol-bis[3-(3-t-butyl-5-methyl-4-hydroxyphenyl) propionate], 3,9-bis{2-[3-(3-t-butyl-4-hydroxy-5-methylphenyl)propynyloxy]-1,1-dimethylethyl}-2,4,8,10-tetraoxaspiro[5.5]undecane, 3,5-di-t-butyl-4-hydroxybenzylphosphonate-diethyl ester, 1,3,5-trimethyl-2,4,6-tris(3,5-di-t-butyl-4-hydroxybenzyl)benzene, and 1,3,5-tris(4-t-butyl-3-hydroxy-2,6-dimethylbenzyl)isocyanuric acid.

The phosphite-based compound is exemplified by, but not limited to, trioctyl phosphite, trilauryl phosphite, tridecyl phosphite, octyl diphenyl phosphite, trisisodecyl phosphite, phenyl diisodecyl phosphite, phenyl di(tridecyl) phosphite, diphenyl isooctyl phosphite, diphenylisodecylphosphite, diphenyl(tridecyl) phosphite, triphenyl phosphite, tris(nonylphenyl) phosphite, tris(2,4-di-t-butylphenyl) phosphite, tris (2,4-di-t-butyl-5-methylphenyl) phosphite, tris(butoxyethyl) phosphite, 4,4'-butylidene-bis(3-methyl-6-t-butylphenyl-tetratridecyl)diphosphite, tetra($C_{12-15}$ mixed alkyl)-4,4'-isopropylidenediphenyl diphosphite, 4,4'-isopropylidene-bis(2-t-butylphenyl)di(nonylphenyl) phosphite, tris(biphenyl) phosphite, tetra(tridecyl)-1,1,3-tris(2-methyl-5-t-butyl-4-hydroxyphenyl)butane diphosphite, tetra(tridecyl)-4,4'-butylidene-bis(3-methyl-6-t-butylphenyl)diphosphite, tetra ($C_{1-15}$ mixed alkyl)-4,4'-isopropilidene diphenyl diphosphite, tris (mono- and di-mixed nonylphenyl) phosphite, 4,4'-isopropylidene-bis(2-t-butylphenyl)di(nonylphenyl) phosphite, 9,10-dihydro-9-oxa-9-oxa-10-phosphaphenanthrene-10-oxide, tris(3,5-di-t-butyl-4-hydroxyphenyl) phosphite, hydrogenated 4,4'-isopropylidene phenylpoly phosphite, bis(octylphenyl)bis(4,4'-butylidene-bis(3-methyl-6-t-butylphenyl)) 1,6-hexanol diphosphite, hexatridecyl-1,1,3-tris(2-methyl-4-hydroxy-5-t-butylphenyl) diphosphite, tris(4,4'-isopropylidene bis(2-t-butylphenyl)) phosphite, tris(1,3-stearoyloxyisopropyl) phosphite, 2,2-methylenebis(4,6-di-t-butylphenyl)octyl phosphite, 2,2-methylene-bis(3-methyl-4,6-di-t-butylphenyl)-2-ethylhexyl phosphite, tetrakis(2,4-di-t-butyl-5-methylphenyl)-4,4'-biphenylene diphosphite, and tetrakis(2,4-di-t-butylphenyl)-4,4'-biphenylene diphosphite.

The phosphate-based compound is exemplified by, but not specifically limited to, pentaerythritol-type phosphite compound. The pentaerythritol-type phosphite compound is exemplified by 2,6-di-t-butyl-4-methylphenyl phenyl pentaerythritol diphosphite, 2,6-di-t-butyl-4-methylphenyl methyl pentaerythritol diphosphite, 2,6-di-t-butyl-4-methylphenyl 2-ethylhexyl-pentaerythritol diphosphite, 2,6-di-t-butyl-4-methylphenyl isodecyl pentaerythritol diphosphite, 2,6-di-t-butyl-4-methylphenyl lauryl pentaerythritol diphosphite, 2,6-di-t-butyl-4-methylphenylisotridecylpentaerythritol diphosphite, 2,6-di-t-butyl-4-methylphenyl stearyl pentaerythritol diphosphite, 2,6-di-t-butyl-4-methylphenyl cyclohexyl pentaerythritol diphosphite, 2,6-di-t-butyl-4-methylphenyl benzyl pentaerythritol diphosphite, 2,6-di-t-butyl-4-methylphenyl ethylcellosolve pentaerythritol diphosphite, 2,6-di-t-butyl-4-methylphenyl butylcarbitol pentaerythritol diphosphite, 2,6-di-t-butyl-4-methylphenyl octylphenyl pentaerythritol diphosphite, 2,6-di-t-butyl-4-methylphenyl nonylphenyl pentaerythritol diphosphite, bis (2,6-di-t-butyl-4-methylphenyl)pentaerythritol diphosphite, bis(2,6-di-t-butyl-4-ethylphenyl)pentaerythritol diphosphite, 2,6-di-t-butyl-4-methylphenyl 2,6-di-t-butylphenyl pentaerythritol diphosphite, 2,6-di-t-butyl-4-methylphenyl 2,4-di-t-butylphenyl pentaerythritol diphosphite, 2,6-di-t-butyl-4-methylphenyl 2,4-di-t-octylphenyl pentaerythritol diphosphite, 2,6-di-t-butyl-4-methylphenyl 2-cyclohexylphenyl pentaerythritol diphosphite, 2,6-di-t-amyl-4-methylphenyl phenyl pentaerythritol diphosphite, bis(2,6-di-t-amyl-4-methylphenyl)pentaerythritol diphosphite, and bis(2,6-di-t-octyl-4-methylphenyl)pentaerythritol diphosphite.

The pentaerythritol-type phosphite compound is preferably bis(2,6-di-t-butyl-4-methylphenyl)pentaerythritol diphosphite, bis(2,6-di-t-butyl-4-ethylphenyl)pentaerythritol diphosphite, bis(2,6-di-t-amyl-4-methylphenyl)pentaerythritol diphosphite, and bis(2,6-di-t-octyl-4-methylphenyl) pentaerythritol diphosphite, wherein bis(2,6-di-t-butyl-4-methylphenyl)pentaerythritol diphosphite is more preferable.

The hindered amine-based compound is exemplified by, but not specifically limited to, 4-acetoxy-2,2,6,6-tetramethylpiperidine, 4-stearoyloxy-2,2,6,6-tetramethylpiperidine, 4-acryloyloxy-2,2,6,6-tetramethylpiperidine, 4-(phenylacetoxy)-2,2,6,6-tetramethylpiperidine, 4-benzoyloxy-2,2,6,6-tetramethylpiperidine, 4-methoxy-2,2,6,6-tetramethylpiperidine, 4-stearyloxy-2,2,6,6-tetramethylpiperidine, 4-cyclohexyloxy-2,2,6,6-tetramethylpiperidine, 4-benzyloxy-2,2,6,6-tetramethylpiperidine, 4-phenoxy-2,2,6,6-tetramethylpiperidine, 4-(ethylcarbamoyloxy)-2,2,6,6-tetramethylpiperidine, 4-(cyclohexylcarbamoyloxy)-2,2,6,6-tetramethylpiperidine, 4-(phenylcarbamoyloxy)-2,2,6,6-tetramethylpiperidine, bis(2,2,6,6-tetramethyl-4-piperidyl) carbonate, bis(2,2,6,6-tetramethyl-4-piperidyl) oxalate, bis (2,2,6,6-tetramethyl-4-piperidyl) malonate, bis(2,2,6,6-tetramethyl-4-piperidyl) sebacate, bis(2,2,6,6-tetramethyl-4-piperidyl) adipate, bis(2,2,6,6-tetramethyl-4-piperidyl) terephthalate, 1,2-bis(2,2,6,6-tetramethyl-4-piperidyloxy)-ethane, α,α'-bis(2,2,6,6-tetramethyl-4-piperidyloxy)-p-xylene, bis(2,2,6,6-tetramethyl-4-piperidyltrilene-2,4-dicarbamate, bis(2,2,6,6-tetramethyl-4-piperidyl)-hexamethylene-1,6-dicarbamate, tris(2,2,6,6-tetramethyl-4-piperidyl)-benzene-1,3,5-tricarboxylate, tris(2,2,6,6-tetramethyl-4-piperidyl)-benzene-1,3,4-tricarboxylate, 1-[2-13-(3,5-di-t-butyl-4-hydroxyphenyl)propionyloxy}butyl]-4-[3-(3,5-di-t-butyl-4-hydroxyphenyl)propionyloxy]2,2,6,6-tetramethylpiperidine, and condensate of 1,2,3,4-butanetetracarboxylic acid and 1,2,2,6,6-pentamethyl-4-piperidinol and α,α,α',α'-tetramethyl-3,9-[2,4,8,10-tetraoxaspiro(5.5)undecane]diethanol.

The triazine-based compound is exemplified by, but not specifically limited to, hydroxyphenyltriazines.

The hydroxyphenyltriazines are exemplified by 2,4,6-tris (2'-hydroxy-4'-octyloxyphenyl)-1,3,5-triazine, 2-(2'-hydroxy-4'-hexyloxyphenyl)-4,6-diphenyl-1,3,5-triazine, 2-(2'-hydroxy-4'-octyloxyphenyl)-4,6-bis(2',4'-dimethyl phenyl)-1,3,5-triazine, 2-(2',4'-dihydroxyphenyl)-4,6-bis(2',4'-dimethylphenyl)-1,3,5-triazine, 2,4-bis(2'-hydroxy-4'-propyloxyphenyl)-6-(2',4'-dimethylphenyl)-1,3,5-triazine, 2-(2-hydroxy-4-octyloxyphenyl)-4,6-bis(4'-methylphenyl)-1,3,5-triazine, 2-(2'-hydroxy-4'-dodecyloxyphenyl)-4,6-bis(2',4'-dimethylphenyl)-1,3,5-triazine, 2,4,6-tris(2'-hydroxy-4'-isopropyloxyphenyl)-1,3,5-triazine, 2,4,6-tris(2'-hydroxy-4'-n-hexyloxyphenyl)-1,3,5-triazine, and 2,4,6-tris(2'-hydroxy-4'-ethoxycarbonylmethoxyphenyl)-1,3,5-triazine.

The sulfur-containing compound is exemplified by, but not specifically limited to, pentaerythrityl tetrakis(3-laurylthiopropionate), dilauryl-3,3'-thiodipropionate, dimyristyl-3,3'-thiodipropionate, and distearyl-3,3'-thiodipropionate.

Content of the heat stabilizer, per 100 parts by weight in total of the thermoplastic resin and the inorganic fiber, is generally 0.001 parts by weight or more, preferably 0.01 parts by weight or more, and furthermore preferably 0.03 parts by weight or more, and, generally 3 parts by weight or less, preferably 2 parts by weight or less, and more preferably 1 part by weight or less. If the amount of heat stabilizer is too small, the heat stabilizing effect may be insufficient, whereas if too much, the effect may saturate to degrade the economy.

<Method of Manufacturing Thermoplastic Resin Composition>

Methods of manufacturing the thermoplastic resin composition of the present invention are arbitrarily selectable.

An exemplary method is such as mixing the thermoplastic resin, the inorganic fiber, the LDS additive and so forth using a mixing means such as a V-type blender, and then melt-kneading the thus-prepared bulk blend in a vented extruder for pelletizing. Another exemplary method relates to a two-stage kneading process, according to which the components other than the inorganic fiber are thoroughly mixed in advance, then melt-kneaded in a vented extruder to produce pellets, the thus-obtained pellets are mixed with the inorganic fiber, and the mixture is again melt-kneaded in the vented extruder.

A still another exemplary method is such as preparing in advance a thorough mixture of the components other than the inorganic fiber using a V-type blender, feeding the thus-obtained mixture through a first chute of a vented twin screw extruder, feeding the inorganic fiber through a second chute in midway of the extruder, followed by melt-kneading and pelletizing.

In a screw configuration of a kneading zone of the extruder, an element for enhancing kneading is preferably placed on the upstream side, and an element with a pressurizing function is preferably placed on the downstream side.

The element for enhancing kneading is exemplified by progressive kneading disc element, orthogonal kneading disc element, wide kneading disc element, and progressive mixing screw element.

Heating temperature in the melt-kneading is arbitrarily selectable, generally in the range from 180 to 360° C. If the temperature is too high, decomposition gas is more likely to generate, which is causative of clouding. The screw configuration is preferably selected in, consideration of shear heating and so forth. From the viewpoint of suppressing decomposition during kneading and post-processes, an antioxidant or heat stabilizer is preferably used.

Methods of manufacturing the resin molded article are arbitrarily selectable from those generally employed for molded article of thermoplastic resin composition, without special limitation. Examples of the methods include hollow molding processes such as injection molding, ultra high-speed injection molding, injection compression molding, two color formation and gas-assisted molding; method of molding using heat insulating dies, method of molding using rapid heating dies, foam molding (including supercritical fluid), insert molding, IMC (in-mold coating), extrusion molding, sheet molding, thermoforming, rotational molding, laminate molding, press molding, and blow molding. Also a method of molding based on the hot-runner system may be used.

Next, a method of providing the plated layer on the surface of the resin molded article molded from the thermoplastic resin composition of the present invention will be explained referring to FIG. 1. FIG. 1 is a schematic drawing illustrating a process of forming the plated layer on the surface of a resin molded article, by the laser direct structuring technique. The resin molded article 1 illustrated in FIG. 1 as a flat substrate, is not always necessarily a flat substrate, and may instead be a partially or wholly curved resin molded article. The resin molded article includes not only final products, but also various components. The resin molded article in the present invention is preferably a component for portable electronic instrument. The component for portable electronic instrument has all features of excellent impact resistance, rigidity and heat resistance, and small anisotropy and small warpage, and is very useful for composing internal structures and enclosures of electronic organizer, PDA such as mobile computer, pager, mobile phone, PHS and so forth. The resin molded article is very suitable for composing flat-shaped mobile electronic instrument with an average thickness (excluding ribs) of 1.2 mm or smaller (the lower limit value is typically 0.4 mm or above, although not specifically limited), and particularly suitable for enclosures.

Referring now back to FIG. 1, the resin molded article 1 is irradiated with the laser light 2. The laser light herein is arbitrarily selectable from those obtainable by publicly-known lasers including YAG laser, excimer laser and electromagnetic wave, without special limitation. YGA laser is preferable. Wavelength of the laser light is not specifically limited, preferably in the range from 200 nm to 1,200 nm, and particularly in the range from 800 to 1,200 nm.

Upon irradiation with the laser light, the resin molded article 1 is activated only in the portions thereof irradiated by the laser light. While being kept in the activated state, the resin molded article 1 is applied with the plating solution 4. The plating solution 4 is widely selectable from publicly-known ones without special limitation, preferably from those containing copper, nickel, gold, silver or palladium as a metal component, where copper is more preferable.

Methods of applying the plating solution 4 to the resin molded article 1 are not specifically limited, and are exemplified by a method of dipping the resin molded article into a bath containing the plating solution. The resin molded article after being applied with the plating solution has the plated layer 5 only in the portions thereof irradiated by the laser light.

According to the method of the present invention, a line pattern of 1 mm pitch or narrower, and even 150 μm or narrower may be formed (the lower limit value is typically 30 μm or larger, although not specifically determined). The line pattern may be used as an antenna on the component for portable electronic instrument. In other words, one preferable embodiment of the resin molded article of the present invention is exemplified by a component for portable electronic instrument, having on the surface thereof the plated layer which functions as an antenna.

For any other aspects, descriptions in JP-A-2011-219620, JP-A-2011-195820, JP-A-2011-178873, JP-A-2011-168705 and JP-A-2011-148267 are appropriately referred to.

EXAMPLES

The present invention will further be explained referring to Examples. All of the materials, amounts of use, ratios, details of processes and procedures of processes may appropriately be altered, without departing from the spirit of the present invention. Accordingly, the present invention is not understood to be limited by the specific examples below.

<Exemplary Manufacture 1>
(Synthesis of Polyamide (PAMP6))

Adipic acid was melted under heating in a reactor can under a nitrogen atmosphere, and while stirring the content, a 3:7 mixed diamine, in molar ratio, of para-xylylenediamine (from Mitsubishi Gas Chemical Corporation, Inc.) and meta-xylylenediamine (from Mitsubishi Gas Chemical Corporation, Inc.) was gradually dropped under pressure (0.35 Mpa) so as to adjust the molar ratio of diamine and adipic acid (from Rhodia) to approximately 1:1, during which temperature was elevated up to 270° C. After the dropping, the pressure was reduced down to 0.06 MPa, the reaction was allowed to proceed for 10 minutes, to thereby control the content of fraction with a molecular weight of 1,000 or smaller. Thereafter, the content was taken out in the form of strand, and pelletized using a pelletizer. The thus-obtained polyamide is referred to as "PAMP6", hereinafter.

<Exemplary Manufacture 2>
(Synthesis of Polyamide (PAMP10))

Sebacic acid was melted under heating in a reactor can under a nitrogen atmosphere, and while stirring the content, a 3:7 mixed diamine, in molar ratio, of para-xylylenediamine (from Mitsubishi Gas Chemical Corporation, Inc.) and meta-xylylenediamine (from Mitsubishi Gas Chemical Corporation, Inc.) was gradually dropped under pressure (0.35 Mpa) so as to adjust the molar ratio of diamine and adipic acid to approximately 1:1, during which temperature was elevated up to 235° C. After the dropping, the reaction was allowed to proceed for 60 minutes, to thereby control the content of fraction with a molecular weight of 1,000 or smaller. After the reaction, the content was taken out in the form of strand, and pelletized using a pelletizer. The thus-obtained polyamide is referred to as "PAMP10", hereinafter.

<Exemplary Manufacture 3>
(Synthesis of Polyamide (PAP10))

Into a 50-liter reactor vessel equipped with a stirrer, a partial condenser, a condenser, a thermometer, a dropping device, a nitrogen gas introducing pipe, and a strand die, 8,950 g (44.25 mol) of precisely weighed sebacic acid (under the product name of sebacic acid TA, from Ito Oil Chemicals Co. Ltd.), 12.54 g (0.074 mol) of calcium hypophosphite, and 6.45 g (0.079 mol) of sodium acetate were placed. The inner space of the reactor vessel was thoroughly replaced with nitrogen, then pressurized with nitrogen up to 0.4 MPa, and the content was heated under stirring from 20° C. up to 190° C. over 55 minutes to thereby uniformly dissolve sebacic acid. Next, 5,960 g (43.76 mol) of para-xylylenediamine (from Mitsubishi Gas Chemical Corporation, Inc.) was dropped under stirring over 110 minutes. In this process, the internal temperature of the reactor vessel was continuously elevated up to 293° C. In the process of dropping, the pressure was controlled to 0.42 MPa, and the produced water was removed out from the system through the partial condenser and the condenser. Temperature of the partial condenser was controlled to the range from 145 to 147° C. After dropping of para-xylene diamine, the poly-condensation reaction was allowed to proceed at an internal pressure of 0.42 MPa for 20 minutes. In this process, the internal temperature of the reactor vessel was elevated up to 296° C. Thereafter, the internal pressure of the reactor vessel was reduced from 0.42 MPa down to 0.12 MPa over 30 minutes. In this process, the internal temperature was elevated up to 298° C. Thereafter, the pressure was reduced at a rate of 0.002 MPa/min over 20 minutes down to 0.08 MPa, to thereby control the content of fraction with a molecular weight of 1,000 or smaller. The internal temperature at the end of reduction of pressure was found to be 301° C. Thereafter, the system was pressurized with nitrogen, and while keeping the internal temperature at 301° C. and the resin temperature at 301° C., the polymer was taken out from the strand die in the form of strand, cooled with cooling water at 20° C., the strand was pelletized to thereby obtain approximately 13 kg of polyamide resin. Cooling time in the cooling water was 5 seconds, and the take-up speed of the strand was adjusted to 100 m/min. The polyamide resin is referred to as "PAP10", hereinafter.

Polyester resin: NOVAPEX (product No. GG500D) (from Mitsubishi Chemical Corporation)
Polyphenylene sulfide resin (PPS): Torelina (Product No. A670X01(N)) (from Toray Industries, Inc.)

<Inorganic Fiber>
03T-296GH: glass fiber (from Nippon Electric Glass Co. Ltd.) (Mohs hardness: 6.5)
03T-187: glass fiber (from Nippon Electric Glass Co. Ltd.) (Mohs hardness: 6.5)
JA-FT2A: glass fiber (from Owens Corning) (Mohs hardness: 6.5)

<LSD Additive>
(1) Lazerflair 8840: $Cu_3(PO_4)_2Cu(OH)_2$ (from MERCK) (Mohs hardness≤5)
(2) Lazerflair 820: mixture of mica coated with $(Sb/Sn)O_2$ (36 to 50% by weight), $SiO_2$ (35 to 53% by weight) and $TiO_2$ (11 to 15% by weight) (from MERCK) (Mohs hardness 5.0)
(3) Black 1G: $CuCr_2O_4$ (from Shepherd Color Company) (Mohs hardness=5.5 to 6)
(4) Black 30C965: $CuCr_2O_4$ (from Shepherd Color Company) (Mohs hardness=5.5 to 6)
(5) 42-920A: mixture of $Bi_2O_3$ (98 to 99% by weight) and $Nd_2O_3$ (0.3 to 1.0% by weight) (from Tokan Material Technology Co. Ltd.) (Mohs hardness≤5.0)

<Mold Releasing Agent>
CaV102: mixture of calcium montanate (from Clariant)
405MP: polyethylene wax (from Mitsui Chemicals, Inc.)

<Alkali>
$Ca(OH)_2$
$Mg(OH)_2$

<Talc>
Talc: Micron White 5000S, from Hayashi-Kasei Co. Ltd.

<Compound>
The individual components were respectively weighed according to the compositional ratios listed in Tables shown later, the components other than the inorganic fiber were mixed in a tumbler, the mixture was loaded from the base end of a twin screw extruder (TEM26SS, from Toshiba Machine Co. Ltd.), melted, the inorganic fiber was side-fed, to thereby manufacture resin pellets. Temperature of the extruder was equally set over the entire portion thereof, and was varied depending on species of the resin. The temperature was set to 280° C. for PAMP6 and PAMP10, 300° C. for PAP10, 280° C. for NOVAPET, and 310° C. for PPS.

<Manufacture of ISO Tensile Test Specimen>
Each pellet obtained by the method of manufacturing described above was dried at 80° C. for 5 hours, and molded into ISO tensile test specimens (3 mm thick, and 4 mm thick), using an injection molding machine (100 T) from Fanuc Corporation, at a cylinder temperature of 280° C. and a die temperature of 130° C.

Injection speed: set to 300 mm/s, by calculating flow rate of the resin based on the cross-sectional area at the center portion of the ISO tensile test specimen. Timing of VP switchover into dwelling was set to approximately 95% of filling. Dwelling was maintained for 25 seconds at 500 kgf/cm², which was determined slightly high but without causing flashes.

<Bending Strength and Flexural Modulus>
In compliance with ISO178, using the ISO tensile test specimen (4 mm thick), bending strength (in MPa) and flexural modulus (in MPa) were measured at 23° C.

<Charpy Impact Strength>
Using the ISO tensile test specimen (3 mm thick) obtained as described above, and in compliance with ISO179, notched Charpy impact strength and unnotched Charpy impact strength were measured at 23° C. Results are shown in Tables below.

<Plate Check>

Into a cavity of a die, with a size of 100×100 mm and a thickness of 2 mm, the resin was filled through a fan gate with a width of 100 mm and a thickness of 0.8 mm to produce a molded article. The gate portion was cut off to obtain a plate-type test piece.

<Color Uniformity of Plate (Visual Check)>

The plate-type test piece obtained above was visually checked, and evaluated as follows. Results are shown in Tables below.

○: Uniform color as a whole
x: Partially or wholly non-uniform

<Appearance of Plating>

A 10×10 mm area of the plate-like test piece obtained above was irradiated with a 1064 nm YAG laser with an output of 10 W, a frequency of 80 kHz, and a speed of 3 m/s. The test piece was then subjected to electroless plating in M-Copper 85 plating bath from MacDermid, Inc. Platability was visually determined based on the thickness of copper layer plated within a predetermined time.

Evaluation criteria are as follow. Results are shown in Tables below.

⊚: Very good appearance (thick plated layer confirmed based on deep copper color)
○: Good appearance
Δ: Plating confirmed but slightly thin (acceptable for practical use)
X: No plating

TABLE 1

| | | | Exam. 1-1 | Exam. 1-2 | Exam. 1-3 | Exam. 1-4 | Exam. 1-5 | Exam. 1-6 | Exam. 1-7 | Exam. 1-8 | Exam. 1-9 | Exam. 1-10 |
|---|---|---|---|---|---|---|---|---|---|---|---|---|
| Resin | PAMP6 | parts by weight | 100 | 100 | 100 | 100 | 100 | | | 100 | | 100 |
| | PAMP10 | parts by weight | | | | | | 100 | 100 | | | |
| | PAP10 | parts by weight | | | | | | | | | 100 | |
| Inorganic fiber | 03T-296GH | parts by weight | 70 | | 70 | 70 | 80 | 70 | 70 | 110 | 70 | 70 |
| | JA-FT2A | parts by weight | | 70 | | | | | | | | |
| LDS additive | Lazerflair8840 | parts by weight | 7 | 7 | 7 | 7 | 20 | 7 | 7 | 8 | 7 | 7 |
| | Black1G | parts by weight | | | | | | | | | | |
| | Black30C965 | parts by weight | | | | | | | | | | |
| | 42-920A | parts by weight | | | | | | | | | | |
| Mold releasing agent | CaV102 | parts by weight | 0.6 | 0.6 | 0.6 | 0.6 | 0.6 | 0.6 | 0.6 | 0.6 | 0.6 | 0.6 |
| Alkali | Ca(OH)$_2$ | parts by weight | | | | 0.3 | | | | 0.3 | | |
| | Mg(OH)$_2$ | parts by weight | | | | | 0.5 | | | | | |
| | Talc | parts by weight | | | | | | | | | | 8 |
| Results | Bending strength (MPa) | | 322 | 318 | 311 | 314 | 301 | 265 | 257 | 340 | 268 | 315 |
| | Flexural modulus (GPa) | | 16 | 15.9 | 15.7 | 15.9 | 16.7 | 13.3 | 13.5 | 19.4 | 13.9 | 16.8 |
| | Charpy impact strength, notched (kJ/m$^2$) | | 8.5 | 8.6 | 7.9 | 8.1 | 7.5 | 9.3 | 9.1 | 11.1 | 9.1 | 8.7 |
| | Charpy impact strength, unnotched (kJ/m$^2$) | | 51 | 54 | 46 | 47 | 45 | 55 | 53 | 65 | 50 | 47 |
| | Color uniformity of plate (visual check) | | X | X | ○ | ○ | X | X | ○ | X | X | X |
| | Appearance of plating | | ○ | ○ | ○ | ○ | ⊚ | ○ | ○ | Δ | ○ | ⊚ |

TABLE 2

| | | | Exam. 2-1 | Exam. 2-2 | Exam. 2-3 | Exam. 2-4 | Exam. 2-5 |
|---|---|---|---|---|---|---|---|
| Resin | PAMP6 | parts by weight | 100 | 100 | 100 | | 100 |
| | PAMP10 | parts by weight | | | | 100 | |
| Inorganic fiber | 03T-296GH | parts by weight | 70 | | 74 | 70 | 70 |
| | JA-FT2A | parts by weight | | 70 | | | |
| LDS additive | Lazerflair820 | parts by weight | 5 | 5 | 11 | 5 | 5 |
| | Black1G | parts by weight | | | | | |
| | Black30C965 | parts by weight | | | | | |
| | 42-920A | parts by weight | | | | | |
| Mold releasing agent | CaV102 | parts by weight | 0.6 | 0.6 | 0.6 | 0.6 | 0.6 |
| | Talc | parts by weight | | | | | 8 |
| Results | Bending strength (MPa) | | 338 | 332 | 338 | 275 | 321 |
| | Flexural modulus (GPa) | | 15.9 | 15.2 | 16.6 | 13.4 | 16.4 |
| | Charpy impact strength, notched | | 9.2 | 9 | 10 | 10.4 | 9.1 |
| | Charpy impact strength, unnotched | | 53 | 53 | 51 | 60 | 46 |
| | Appearance of plating | | Δ | Δ | ○ | Δ | ⊚ |

TABLE 3

| | | | Exam. 3-1 | Exam. 3-2 | Exam. 3-3 |
|---|---|---|---|---|---|
| Resin | NOVAPET | parts by weight | 100 | 100 | |
| | PPS | parts by weight | | | 100 |
| Inorganic filler | 03T-296GH | parts by weight | | | 70 |
| | 03T-187 | parts by weight | 70 | 70 | |

TABLE 3-continued

|  |  |  | Exam. 3-1 | Exam. 3-2 | Exam. 3-3 |
|---|---|---|---|---|---|
| LDS additive | Black1G | parts by weight | | | |
| | Lazerflair820 | parts by weight | 5 | | 5 |
| | Lazerflair8840 | parts by weight | | 5 | |
| Mold releasing agent | 405MP | parts by weight | 0.6 | 0.6 | 0.6 |
| Results | Bending strength (MPa) | | 265 | 262 | 196 |
| | Flexural modulus (GPa) | | 14.1 | 13.8 | 11.3 |
| | Charpy impact strength, notched | | 9.6 | 10.5 | 14.4 |
| | Charpy impact strength, unnotched | | 57.2 | 50.7 | 50.2 |
| | Appearance of plating | | Δ | Δ | Δ |

(Examples 1-10, 2-5). This was because the talc absorbed the laser light, and thereby the plated layer became more readily formable.

It was also found that the effect of the present invention was particularly distinctive when polyamide resin was used as the thermoplastic resin.

<Manufacture of Colored Pellet>

Pellets were manufactured respectively in the same way with Examples 1-1 and 2-1, except that, during the compounding, 6 parts by weight of ZnS (L* value: 90%, Mohs hardness: 3) was added. As a consequence, white-colored pellets were manufactured, while keeping the bending strength, flexural modulus and Charpy impact strengths at levels equivalent to those in Examples 1-1 and 2-1.

This patent specification may be compared to and to choose the best of the specification of EP11158893.5, filed to

TABLE 4

|  |  |  | Comp. Exam. 1 | Comp. Exam. 2 | Comp. Exam. 3 | Comp. Exam. 4 | Comp. Exam. 5 | Comp. Exam. 6 | Comp. Exam. 7 | Comp. Exam. 8 | Comp. Exam. 9 | Comp. Exam. 10 |
|---|---|---|---|---|---|---|---|---|---|---|---|---|
| Resin | PAMP6 | parts by weight | 100 | 100 | | 100 | 100 | | 100 | 100 | | |
| | PAMP10 | parts by weight | | | 100 | | | 100 | | | | |
| | NOVAPET | parts by weight | | | | | | | | | 100 | |
| | PPS | parts by weight | | | | | | | | | | 100 |
| Inorganic filler | 03T-296GH | parts by weight | 70 | 70 | 70 | 70 | 67 | 67 | | | 70 | 70 |
| LDS additive | Lazerflair8840 | parts by weight | | | | | | | 7 | | | |
| | Lazerflair820 | parts by weight | | | | | | | | 7 | | |
| | Black1G | parts by weight | 5 | | 5 | | | | | | 5 | 5 |
| | Black30C965 | parts by weight | | 5 | | | | | | | | |
| | 42-920A | parts by weight | | | | 5 | | | | | | |
| Mold releasing agent | CaV102 | parts by weight | 0.6 | 0.6 | 0.6 | 0.6 | 0.6 | 0.6 | 0.6 | 0.6 | | |
| | 405MP | parts by weight | | | | | | | | | 0.6 | 0.6 |
| Results | Bending strength (MPa) | | 260 | 256 | 221 | 312 | 356 | 273 | 143 | 152 | 203 | 161 |
| | Flexural modulus (GPa) | | 14.8 | 14.9 | 12.4 | 15.8 | 15.1 | 13.2 | 4.9 | 5.3 | 12.6 | 10.5 |
| | Charpy impact strength, notched | | 4.1 | 3.8 | 5.1 | 6.5 | 11.7 | 12.9 | 2.8 | 2.4 | 5.3 | 12.9 |
| | Charpy impact strength, unnotched | | 33 | 32 | 35 | 45 | 52 | 63 | 21 | 19 | 34.1 | 39 |
| | Color uniformity of plate (visual check) | | X | X | X | X | X | X | X | ○ | | |
| | Appearance of plating | | ○ | ○ | ○ | X | X | X | ○ | ○ | ○ | ○ |

As is clear from the Tables above, the thermoplastic resin compositions excellent in all of the bending strength, flexural modulus, Charpy impact strengths and appearance of plating were obtained, by using the LDS additives specified by the present invention (Examples 1-1 to 1-10, 2-1 to 2-5, 3-1 to 3-3).

In contrast, Charpy impact strengths were found to be poor, when the LDS additives with large values of Mohs hardness, despite containing copper, were used (Comparative Examples 1 to 3, 9, 10). On the other hand, the appearance of plating was found to be poor, when none of copper, antimony and tin are contained even if the LDS additive was contained (Comparative Example 4), and when the LDS additive was not contained at all (Comparative Examples 5, 6). The bending strength and flexural modulus were found to be poor, when the glass fiber was not contained (Comparative Examples 7, 8).

Good color uniformity of plates were confirmed, when an acidic substance was used as the LDS additive and alkalis were added, despite that the acidic substance was contained. Note, however, that such good color uniformity of plate before being colored is not essential in the present invention, since the plate may be colored with an inorganic pigment as described later in Example.

More better appearance of plating was found to be achieved, when the amount of addition of the LDS additive was increased (Examples 1-5, 2-3). More better appearance of plating was found to be achieved, also by adding talc, without increasing the amount of addition of the LDS additive European Patent Office on Mar. 18, 2011, the content of which is incorporated herein by reference.

The invention claimed is:

1. A thermoplastic resin composition for laser direct structuring comprising, per 100 parts by weight of the thermoplastic resin, 10 to 150 parts by weight of an inorganic fiber and 1 to 30 parts by weight of a laser direct structuring additive, the laser direct structuring additive containing at least one of copper, antimony and tin, and
    wherein the laser direct structuring additive has a Mohs hardness smaller than the Mohs hardness of the inorganic fiber and the difference in Mohs hardness between the laser direct structuring additive and the inorganic fiber is at least 1.5.

2. The thermoplastic resin composition for laser direct structuring of claim 1, wherein the inorganic fiber is a glass fiber.

3. The thermoplastic resin composition for laser direct structuring of claim 1, wherein the thermoplastic resin is a polyamide resin.

4. The thermoplastic resin composition for laser direct structuring of claim 1, further comprising, per 100 parts by weight of the thermoplastic resin composition, 1 to 20 parts by weight of an inorganic pigment having an L* value in the CIELab of 80 or larger and
    wherein the inorganic pigment has a Mohs hardness smaller than the Mohs hardness of the inorganic fiber and the difference in Mohs hardness between the inorganic pigment and the inorganic fiber is at least 1.5.

5. The thermoplastic resin composition for laser direct structuring of claim 1, further comprising, per 100 parts by weight of the thermoplastic resin composition, 1 to 20 parts by weight of talc.

6. The thermoplastic resin composition for laser direct structuring of claim 1, further comprising, per 100 parts by weight of the thermoplastic resin composition, 1 to 20 parts by weight of talc, and the amount of addition, per 100 parts by weight of the thermoplastic resin, of the laser direct structuring additive is 1 to 15 parts by weight.

7. The thermoplastic resin composition for laser direct structuring of claim 1, wherein the inorganic fiber has a Mohs hardness of 5.5 or larger, and the laser direct structuring additive contains copper and has a Mohs hardness of 5.0 or smaller.

8. The thermoplastic resin composition for laser direct structuring of claim 7, further comprising an alkali.

9. The thermoplastic resin composition for laser direct structuring of claim 7, wherein the inorganic pigment has a Mohs hardness of 5.0 or smaller.

10. The thermoplastic resin composition for laser direct structuring of claim 7, wherein the laser direct structuring additive is $Cu_3(PO_4)_2Cu(OH)_2$.

11. The thermoplastic resin composition for laser direct structuring of claim 1, wherein the laser direct structuring additive contains antimony and tin.

12. The thermoplastic resin composition for laser direct structuring of claim 11, wherein the laser direct structuring additive contains antimony and tin, and the content of tin is larger than the content of antimony.

13. The thermoplastic resin composition for laser direct structuring of claim 11, wherein the laser direct structuring additive contains antimony oxide and/or tin oxide.

14. The thermoplastic resin composition for laser direct structuring of claim 13, wherein the laser direct structuring additive contains 36 to 50% by weight of $(Sb/Sn)O_2$, 35 to 53% by weight of a mixture of mica and $SiO_2$, and 11 to 15% by weight of $TiO_2$.

15. A resin molded article obtained by molding the thermoplastic resin composition for laser direct structuring described in claim 1.

16. The resin molded article of claim 15, further comprising a plated layer formed on the surface thereof.

17. The resin molded article of claim 15, configured as a component for a portable electronic instrument.

18. The resin molded article of claim 16, wherein the plated layer functions as an antenna.

19. A method of manufacturing a resin molded article with a plated layer, the method comprising irradiating the surface of a resin molded article, obtained by molding the thermoplastic resin composition for laser direct structuring described in claim 1, and applying a metal to thereby form the plated layer.

20. The method of manufacturing a resin molded article with a plated layer of claim 19, wherein the plated layer is a copper plated layer.

21. A method of manufacturing a component for a portable electronic instrument with an antenna, the method comprising the method of manufacturing a resin molded article with a plated layer of claim 16.

* * * * *